(12) United States Patent
Baumgarte

(10) Patent No.: US 10,785,569 B2
(45) Date of Patent: Sep. 22, 2020

(54) ENCODED AUDIO METADATA-BASED LOUDNESS EQUALIZATION AND DYNAMIC EQUALIZATION DURING DRC

(71) Applicant: Apple Inc., Cupertino, CA (US)

(72) Inventor: Frank Baumgarte, Sunnyvale, CA (US)

(73) Assignee: APPLE INC., Cupertino, CA (US)

(*) Notice: Subject to any disclaimer, the term of this patent is extended or adjusted under 35 U.S.C. 154(b) by 0 days.

(21) Appl. No.: 16/456,559

(22) Filed: Jun. 28, 2019

(65) Prior Publication Data
US 2019/0327558 A1 Oct. 24, 2019

Related U.S. Application Data

(63) Continuation of application No. 15/275,162, filed on Sep. 23, 2016, now Pat. No. 10,341,770.
(Continued)

(51) Int. Cl.
*H04R 3/04* (2006.01)
*G10L 19/00* (2013.01)
(Continued)

(52) U.S. Cl.
CPC ............ *H04R 3/04* (2013.01); *G10L 19/00* (2013.01); *G10L 19/167* (2013.01); *H03G 5/165* (2013.01); *H03G 7/007* (2013.01); *G06F 3/165* (2013.01); *H04N 21/8113* (2013.01); *H04N 21/84* (2013.01); *H04R 2430/01* (2013.01)

(58) Field of Classification Search
CPC ....... H04R 3/04; H04R 2430/01; G10L 19/00; G10L 19/167; H03G 5/165; H03G 7/007; H03G 3/20; H04N 21/8113; H04N 21/84; G06F 3/165
See application file for complete search history.

(56) References Cited

U.S. PATENT DOCUMENTS

2009/0097676 A1* 4/2009 Seefeldt .................... H04S 7/00
                                                              381/107
2013/0279708 A1    10/2013 Seefeldt

FOREIGN PATENT DOCUMENTS

EP          3061090 B1 *  4/2019 .......... G10L 21/034
WO         2015038522     3/2015
WO     WO-2015038475 A1 * 3/2015 ............. G06F 3/165

OTHER PUBLICATIONS

Korean Notice of Preliminary Rejection with English translation for Korean Application No. 10-2019-7013941 dated Dec. 3, 2019, 8 pages.
(Continued)

*Primary Examiner* — Yogeshkumar Patel
(74) *Attorney, Agent, or Firm* — Womble Bond Dickinson (US) LLP

(57) ABSTRACT

Dynamic loudness equalization of received audio content in a playback system, using metadata that includes instantaneous loudness values for the audio content. A playback level is derived from a user volume setting of the playback system, and is compared with a mixing level that is assigned to the audio content. Parameters are computed, that define an equalization filter that is filtering the audio content before driving a speaker with the filtered audio content, based on the instantaneous loudness values and the comparing of the playback level with the assigned mixing level. Other embodiments are also described and claimed.

18 Claims, 7 Drawing Sheets

Related U.S. Application Data

(60) Provisional application No. 62/235,293, filed on Sep. 30, 2015.

(51) Int. Cl.
*G10L 19/16* (2013.01)
*H03G 5/16* (2006.01)
*H03G 7/00* (2006.01)
*H04N 21/81* (2011.01)
*H04N 21/84* (2011.01)
*G06F 3/16* (2006.01)

(56) References Cited

OTHER PUBLICATIONS

Notice of Final Rejection for Korean Application No. 10-2019-7013941 dated Jun. 11, 2020, 7 pages.

\* cited by examiner

ENCODED AUDIO METADATA-BASED LOUDNESS EQUALIZATION AND DYNAMIC EQUALIZATION DURING DRC

This application is a continuation of U.S. application Ser. No. 15/275,162 filed Sep. 23, 2016, which claims the benefit of the earlier filing date of U.S. Provisional Patent Application No. 62/235,293, filed Sep. 30, 2015.

FIELD

An embodiment of the invention relates to digital audio signal processing at the playback-side of the digital audio content that is associated with metadata, to improve the listener's experience. Other embodiments are also described.

BACKGROUND

Audio content such as music or sound tracks of a movie are usually produced with the assumption of a certain playback level (e.g., the "overall gain" that should be applied to the audio signal during playback, between its initial or decoded form to when it is converted into sound by a speaker, in order to obtain a sound pressure level at the listener's position that is the same as what was intended by the producer of the audio content.). If a different playback level is used, the content not only sounds louder or softer but it may also appear to have a different tonal characteristic. An effect known from psychoacoutics is the nonlinear increase of loudness perception at low frequencies as a function of playback level. This effect can be quantified by equal, perceived loudness contours and by measurements of perceived loudness as a function of playback level and signal characteristics. Commonly, a partial loss of low frequency components compared to other frequencies is reported when the content is played back at a lower level than intended by the producer. In the past, loudness equalization was performed by an adaptive filter that amplifies the low frequency range depending on the playback volume setting. Many older audio receivers have a "Loudness" button that works in that way.

SUMMARY

Several schemes for metadata-based loudness equalization (EQ) are described below. Some may have one or more of the following advantages, e.g. reduced playback-side complexity, less delay, and higher quality. Some of the quality improvements may be due to offline processing at the encoding side, which are not restricted by the limitations of the real-time processing and low latency requirements in the playback device. The metadata-based approaches described here may also be seamlessly integrated into the existing MPEG-D DRC standard, ISO/IEC, "Information technology—MPEG audio technologies—Part 4: Dynamic range control," ISO/IEC 23003-4:2015, and work together with dynamic range control.

An approach is also described to provide dynamic EQ within a DRC process. It can achieve similar EQ as a multi-band DRC but with a lower number of bands or just a single band DRC. The dynamic EQ can be controlled by metadata and may be integrated into the popular MPEG-D DRC standard.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one. Also, in the interest of conciseness and reducing the total number of figures, a given figure may be used to illustrate the features of more than one embodiment of the invention, and not all elements in the figure may be required for a given embodiment.

DETAILED DESCRIPTION

Several embodiments of the invention with reference to the appended drawings are now explained. Whenever the shapes, relative positions and other aspects of the parts described in the embodiments are not explicitly defined, the scope of the invention is not limited only to the parts shown, which are meant merely for the purpose of illustration. Also, while numerous details are set forth, it is understood that some embodiments of the invention may be practiced without these details. In other instances, well-known circuits, structures, and techniques have not been shown in detail so as not to obscure the understanding of this description.

The conventional "Loudness" button mechanism introduced above in the Background section neglects the important issue that the amount of low-frequency range loss reported by a listener depends on the acoustic level of that frequency range at the listener, which depends on the audio content itself. An embodiment of the invention is a loudness equalization scheme that takes into account the time-varying levels of spectral bands of the audio content, to control a time-varying filter through which the audio signal is passed (before driving the speaker). The time varying filter (a spectral shaping filter, also referred to here as an equalization filter) aims to compensate for the spectral distortions that will appear due to the nonlinear loudness perception, as a function of playback level and frequency band.

Figure 1:
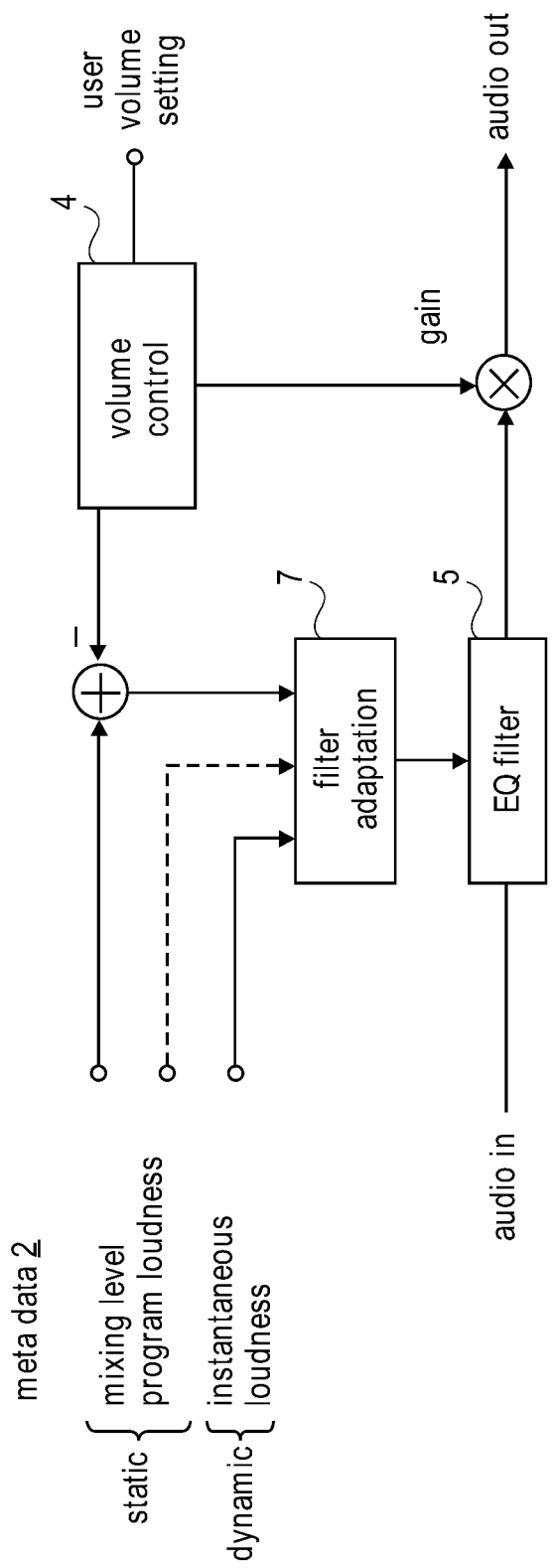
FIG. 1 is a block diagram of a decoding side loudness equalizer that is based on instantaneous loudness values extracted from received metadata of the audio content.

A block diagram showing the concept of a loudness equalizer that operates based on metadata, which is associated with the audio content that is being played back, is given in FIG. 1. This diagram (as well as all of those in the other figures here) refers to digital signal processing (DSP) operations or DSP logic hardware units (e.g., a processor that is executing instructions stored in a machine readable medium such as local storage or memory in a home audio system, a consumer electronics speaker device, or an audio system in a vehicle), also referred to as a decoding and playback system that is receiving the audio content, e.g., a desktop computer, a home audio entertainment system, a set top box, a laptop computer, a tablet computer, a smartphone, or other electronic audio playback system in which the resulting digital audio output signal is converted into analog form and then fed to an audio power amplifier which is driving a speaker (e.g., a loudspeaker, an earphone.) The audio content as initially received, e.g., via Internet streaming or Internet download, may have been encoded and multiplexed with its metadata into a bitstream that has been unpacked and decoded in the playback system, by the time it reaches the processing depicted in the figures here.

The metadata 2 includes static metadata, including the mixing level and optionally the program loudness of the audio content, e.g., as a single value each for the complete content (also referred to here as an audio program or audio asset). The mixing level can be measured during production (or at the encoding side), by following established standards. The program loudness value can be measured using a loudness model, such as the one defined in ITU, "Algorithms to measure audio programme loudness and true-peak audio level," ITU-R BS.1770-3. Furthermore, instantaneous loudness values (e.g., acoustic levels, sound pressure levels, SPLs) are conveyed as dynamic metadata via a metadata stream where a number of instantaneous loudness values are received sequentially over time that describe the sound pressure level (SPL) of the audio content at the listener's expected location on a per frame or block basis (synchronized with the frames of the audio content signal); in other words, the instantaneous loudness changes over a time sequence of such frames or blocks that define the audio content. The metadata may be transferred along with the audio content (indicated as "audio in" in the figures) to the playback or decoding side that is shown, being the decoding and playback system, e.g., via an Internet download or via Internet streaming. At the decoding or playback side, no additional delay is incurred since the instantaneous loudness values are in the metadata, and so a loudness estimation process at the playback side is not necessary. The improved smoothness, the reduced decoder complexity, and the lack of additional delay are all advantages of this proposal, over the state of the art in loudness equalization (which runs exclusively at the playback side without the use of metadata.)

At the playback side, the user's volume setting (for manually controlling the volume of sound from the loudspeaker or earphone during playback) is input to a volume control block 4. The volume control block 4 then generates (e.g. computes, including perhaps via table look up) the appropriate gain value (e.g. a full band scaling factor) that is to be applied to the digital audio output signal ("audio out" in the figures). It also derives a playback level based on the user volume setting and based on its stored or predetermined knowledge of the level transfer characteristics of the playback system (sensitivity). The latter describes how a given audio output signal is rendered as sound having a resulting sound pressure level at the listeners ears (noting that this sensitivity may also depend on factors such as the user volume setting.)

A filter adaptation block 7 takes the metadata 2 and a computed difference between the static mixing level (indicated in the metadata) and the playback level (e.g. as a subtraction between two dB values, also referred to as comparing the mixing and playback levels), and based on that difference generates filter parameters that control (e.g. that define) an equalization (EQ) filter 5. The filter adaptation block 7 may first determine if the playback level is higher or lower than the mixing level. (If the mixing level is not provided by metadata, an average mixing level may be assumed (e.g., one that is commonly used in a sound program or audio recording production environment). If the playback level is lower, a low frequency range and optionally a high frequency range need to be boosted to some degree, depending on the instantaneous loudness reported for the audio content (by the metadata 2). Similarly, these spectral ranges need to be attenuated to some degree if the playback level is higher. The EQ filter 5 is configured to do so, and may be updated on a per frame basis (e.g., for every frame of the digital audio content (audio in) that has an instantaneous loudness value associated with it in the metadata, or by skipping some frames so that the EQ filter 5 need not be updated for every frame of the audio content).

Note that where the playback level is lower than the mixing level, the amount of boost imparted by the EQ filter 5 is larger, the lower the playback level is compared to the mixing level and the lower the instantaneous loudness is. This is due to the increasingly nonlinear loudness perception of humans, versus level, at low sound pressure levels. Also, in one embodiment, where the playback level is found to not be sufficiently different than the mixing level, no spectral shaping by the EQ filter 5 is needed (e.g., its response should be flat at 0 dB.)

In general, it is advantageous to divide the audio spectrum into several bands and to estimate the loudness in each of those bands individually. For the case of loudness equalization that is being addressed here in particular, a band at low frequencies and another one (non-overlapping) at high frequencies may be defined for making the loudness measurements at the encoding side (that appear as a sequence of pairs of instantaneous loudness values in the metadata). This is done as an attempt to model the human auditory perception in those frequency ranges. Alternatively, the instantaneous loudness values may be provided for just a single frequency band, e.g., a low frequency below 200 Hz. In turn, these loudness values are suitable to control the EQ filter 5 in a way that was conceptually described above.

In one embodiment, the information needed to control the EQ filter 5 includes the instantaneous SPL in a certain audio band (spectral range) for the audio content (I) at mixing (production) and (II) at playback. In the following (I) is referred to as $L_{range,mix}(t)$ and (II) as $L_{range,playback}(t)$. Using such input, conventional approaches may then be used to compute a boost gain or a cut gain, as needed in a particular frequency band.

Given the audio content, the instantaneous loudness level can be estimated in an audio band, at the production or encoding side but the absolute level during playback can only be determined when the sensitivity of the playback system is known. For a playback system, the sensitivity $\Delta L_{playback}$ describes a measured difference between the acoustic level [Sound Pressure Level] $L_{playback}$ and the electrical audio signal level of the content [dBFS] that results in that level. For the production system, the sensitivity can be defined as the difference between the electrical audio signal level of the content ($L_{content}$) and the resulting, measured SPL, e.g., the mixing level in SPL. $\Delta L_{mixing}$ The sensitivity of the mixing system may be included as a static value in the metadata. Alternatively, it can be estimated in the playback system by computing the difference between the mixing level (e.g., a measured average SPL in the mixing studio) and average loudness level (both values may be conveyed as metadata.) The average loudness level can for instance be computed by the method described in ITU-R BS.1770-3. This estimate is called program loudness—see FIG. 1. Typically, the sensitivity of the production/mixing system is constant. However, for the playback system it may vary when the user performs volume adjustments, for instance by turning a volume knob of a device.

If the instantaneous loudness values [SPL] cannot be computed or measured at the mixing studio, then an estimated instantaneous loudness level may be computed in the playback-side, based on the absolute content level in [dBFS], $L_{range,content}(t)$ where (t) indicates that is changes over time due to the level fluctuation of the content (audio in). With this estimate, the SPL of the spectral range can be calculated for the mixing side and for the playback side:

$$L_{range,mixing}(t) = L_{range,content}(t) - \text{delta}L_{mixing}$$

and $$L_{range,playback}(t) = L_{range,content}(t) + \text{delta}L_{playback}$$

Alternatively, the average level difference $\Delta L_{acoustic}$ between the production and playback side can be directly calculated based on the average mixing level $L_{mixing}$ and playback level $L_{playback}$:

$$\Delta L_{acoustic} = L_{playback} - L_{mixing}$$

Based on the result, the instantaneous SPL at the playback side is:

$$L_{range,playback}(t) = \Delta L_{acoustic} + L_{range,mix}(t)$$

The human-perceived loudness of a particular spectral range drops nonlinearly at lower sound pressure level, SPL, in the low-frequency range. There are conventional perceived loudness curves that can be measured in a laboratory setting for low frequency and mid-range at mixing, and in a playback scenario.

Conventional techniques may be used to compute the amount of such boost gain, based on various publications of psychoacoustic measurements of frequency and level dependent loudness of various test signals. See, e.g., T. Holman and F Kampmann, "Loudness Compensation: Use and Abuse", Journal of the Audio Engineering Society, July/August 1978, Vol. 26, No. 2/8. Common representations of the data are in the form of equal loudness contours or graphs showing the loudness growth versus level. With such psychoacoustic data, the amount of boost gain can be readily computed (by programming the filter adaptation block 7) as a function of the instantaneous loudness values, and based on the playback and mixing levels as described above. Based on the boost gain value, and the band in which the frequency boost should be applied, the parameters of a digital filter element can be derived that is part of EQ filter 5 and will generate the appropriate boost in the frequency range of interest.

Example EQ Filter Elements

The following show example cut and boost filter elements, for the low and high frequency ranges, which can approximate the desired frequency response for loudness equalization. In this example, several different filter elements are connected to form a cascade, as part of the EQ filter 5 in FIG. 1, where each element may have a cut or boost frequency range while leaving unchanged (0 dB gain in) the rest of the audio spectrum. These are examples of a low frequency shaping filter and a high frequency shaping filter, wherein the low and high frequency shaping filters are in cascade as part of the EQ filter 5.

Each low-frequency shaping filter (that is part of the EQ filter 5) may be a first order IIR filter with real coefficients which has the form:

$$H_{LF}(z) = \frac{1 - b_1 z^{-1}}{1 - a_1 z^{-1}}$$

A low-frequency cut filter may have a fixed coefficient $a_1$ that depends on the desired corner frequency. The filter parameter $b_1$ may be dynamically computed based on boost gain $g_{boost}$ $L_{boost}$ as defined above, as follows:

$$b_1 = \begin{cases} a_1; & L_{boost} \geq 0.0 \\ b_{1,bound}, & a_1 + (b_{1,bound} - a_1)\frac{L_{boost}}{L_{boost,min}}; & L_{boost,min} < L_{boost} < 0.0 \\ b_{1,bound}; & \text{else} \end{cases}$$

A low-frequency boost filter may have a fixed coefficient $b_1$ that depends on the corner frequency. The filter parameter $a_1$ may be dynamically computed based on the linear gain $L_{boost}$:

$$a_1 = \begin{cases} b_1 & L_{boost} \leq 0.0 \\ a_1 + (a_{1,bound} - b_1)\frac{L_{boost}}{L_{boost,max}} & 0.0 < L_{boost} < L_{boost,max} \\ a_{1,bound} & \text{else} \end{cases}$$

Each high-frequency shaping filter may be a second order IIR filter with real coefficients which has the form:

$$H_{HF}(z) = g_{norm}\frac{1 + b_1 z^{-1} + b_2 z^{-2}}{1 + a_1 z^{-1} + a_2 z^{-2}} \quad g_{norm} = \frac{1 + a_1 + a_2}{1 + b_1 + b_2}$$

The corner frequency of the filter may depend on the audio sample rate and the normalized corner frequency
$f_c = f_{c,norm} f_s$
Each high-frequency cut filter may have fixed coefficients, except for b1. The ffklkl
fixed filter coefficients depend on the corner frequency index, and a pole/zero radius parameter:
r=0.45
$a_1 = -2r \cos(2\pi f_{c,norm})$
$a_2 = r^2$
$b_2 = a_2$
The filter parameter $b_1$ may be dynamically computed based on the boost gain, $g_{boost}$ or $L_{boost}$:

$$b_1 = \begin{cases} a_1; & L_{boost} \geq 0.0 \\ a_1 + (b_{1,bound} - a_1)\frac{L_{boost}}{L_{boost,min}}; & L_{boost,min} < L_{boost} < 0.0 \\ b_{1,bound}; & \text{else} \end{cases} \quad A$$

The high-frequency boost filter may have the same coefficients except that the a coefficients are computed in the same way as the b coefficients for the cut filter and the b coefficients are computed in the same way as the a coefficients for the cut filter.

$b_1 = -2r \cos(2\pi f_{c,norm})$
$b_2 = r^2$
$a_2 = b_2$

The filter parameter $a_1$ may be dynamically computed based on the boost gain $L_{boost}$:

$$a_1 = \begin{cases} b_1 & L_{boost} \leq 0.0 \\ b_1 + (a_{1,bound} - b_1)\frac{L_{boost}}{L_{boost,max}}; & 0.0 < L_{boost} < L_{boost,max} \\ a_{1,bound} & \text{else} \end{cases}$$

Figure 2:
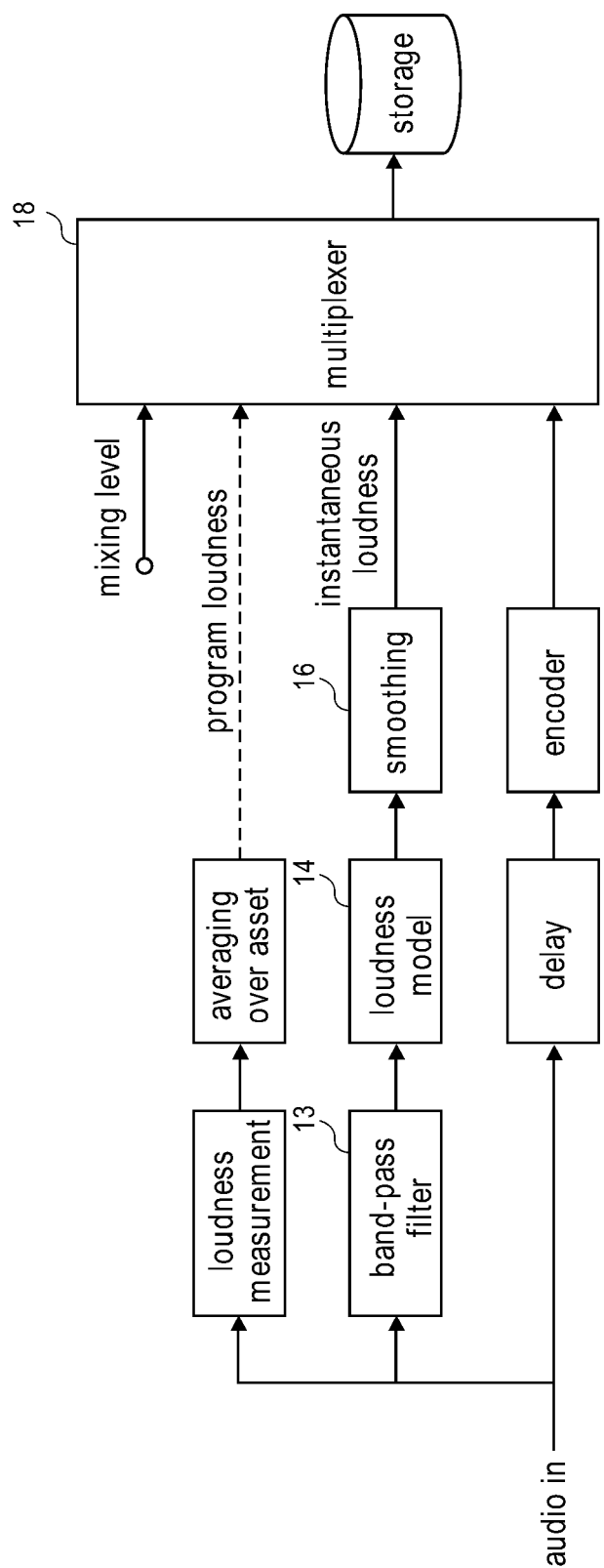
FIG. 2 is a block diagram of a production or encoding side system for generating metadata including instantaneous loudness values.

An example production/encoding side system is shown in FIG. 2 for producing the metadata that includes instantaneous loudness (e.g., SPL) values for a given audio program. To improve the accuracy of the instantaneous loudness or SPL measurement made at the encoding side, for purposes of better downstream control of the EQ filter 5 in the playback side, the audio signal may first be processed by a band-pass filter 13 that removes all components outside of a spectral range of interest (the spectral range that is to be modified by EQ filter 5), before the audio signal enters a loudness measurement module 14. In this manner, more accurate estimates of instantaneous loudness can be achieved, to obtain better, perceived quality of the loudness equalization in that spectral range. The instantaneous loudness can be derived, for instance, by the loudness measurement module 14 computing the short-term energy at the output of the band-pass filter 13, and by then smoothing (smoothing bock 16) of the computed short term energy sequence to avoid fast fluctuations of the instantaneous loudness value. In the case of off-line processing of the audio content (as compared to live streaming), the look-ahead of the smoothing can be increased to improve the smoothness and to avoid artifacts that may otherwise occur if the EQ filter 5 is adapted (in response to the instantaneous loudness values) too rapidly or not at the right time.

Figure 3:
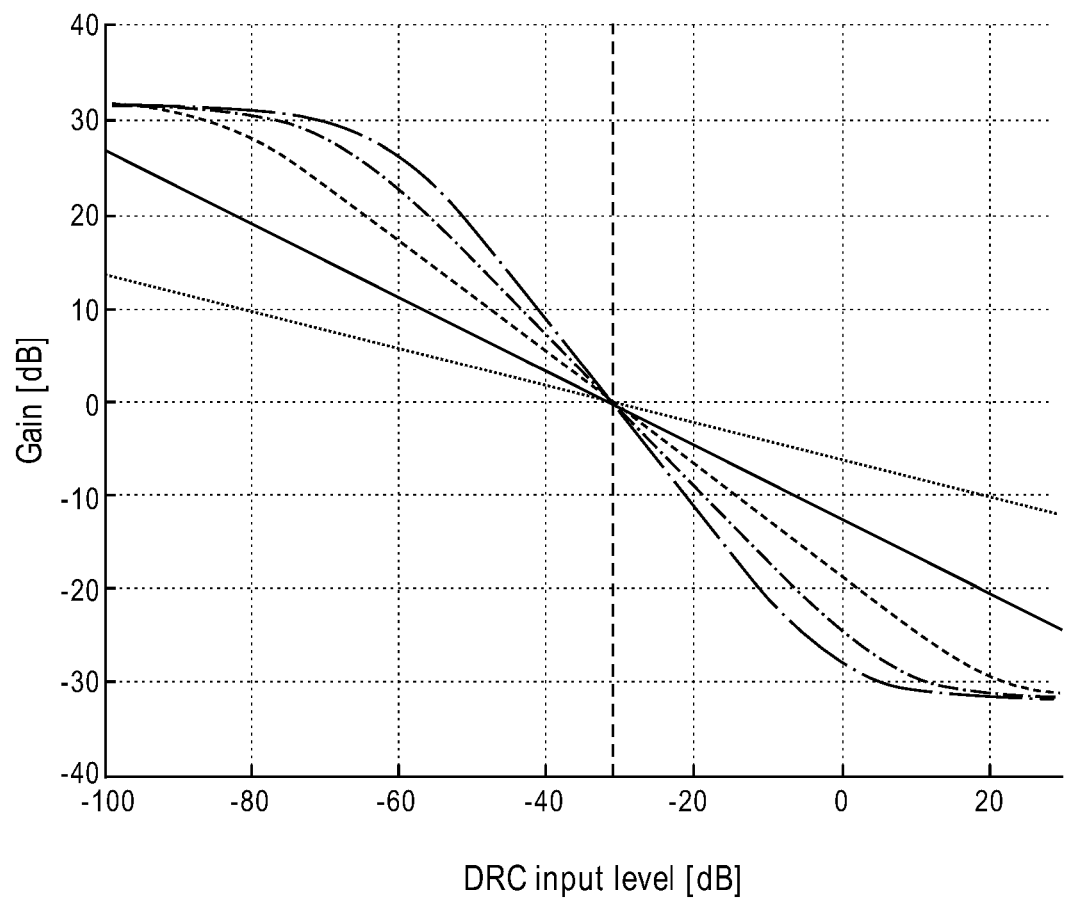
FIG. 3 shows several example DRC characteristics that may be used in the encoding side to compute DRC gain values, and in the decoding side in their inverse forms.

In accordance with another embodiment of the invention, the need to include in the metadata a sequence of instantaneous loudness values (computed at the production or encoding side) is obviated, by using the following approach (to achieve loudness EQ in the decoder side/playback system). ISO/IEC, "Information technology—MPEG audio technologies—Part 4: Dynamic range control," ISO/IEC 23003-4:2015 defines a flexible scheme for loudness and dynamic range control (DRC). It uses gain sequences within metadata, to convey the DRC gain values to the decoder side, to apply a compression effect in the decoder side by applying the DRC gain values to the decoded audio signal. Back at the encoder, these DRC gain values are usually generated by applying a DRC characteristic, such as shown in FIG. 3, to the smoothed instantaneous loudness estimates. FIG. 3 is from ISO/IEC, "Information technology—MPEG audio technologies—Part 4: Dynamic range control," ISO/IEC 23003-4:2015. The DRC input level in the graph of FIG. 3 is a smoothed instantaneous loudness level.

Figure 4:
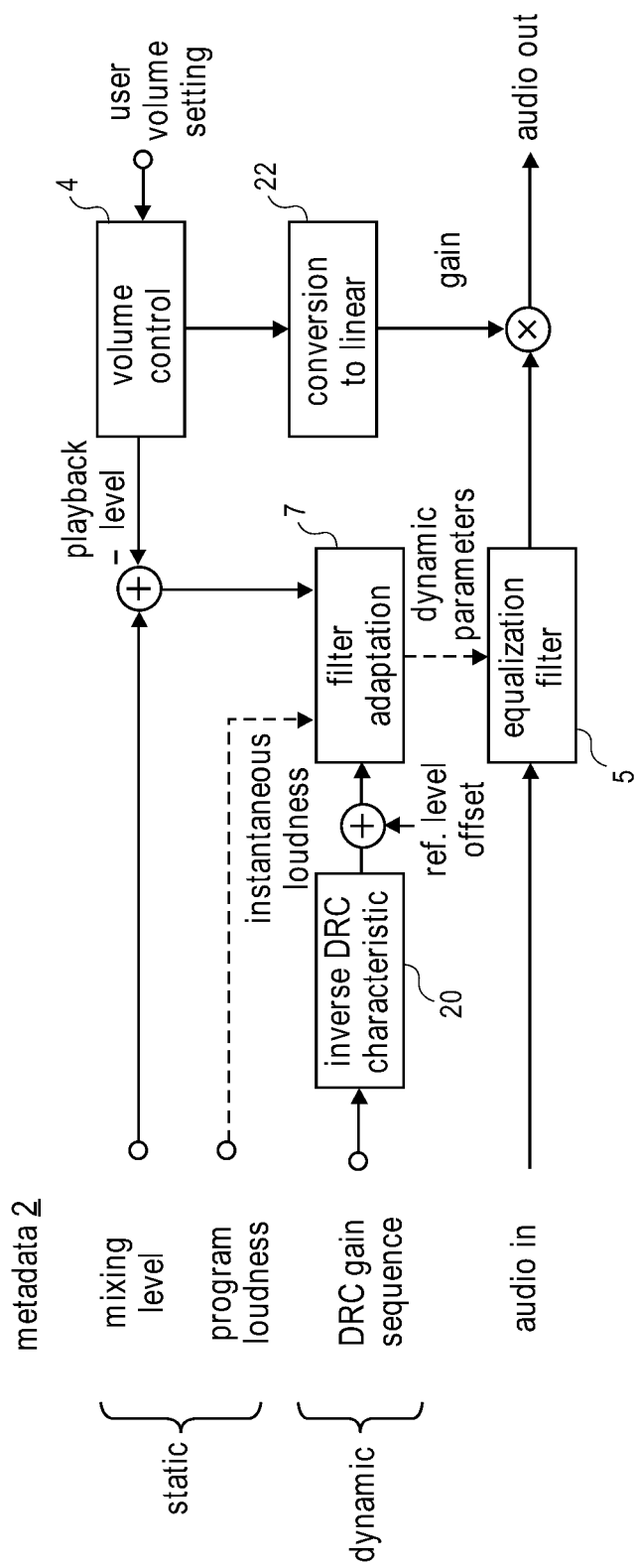
FIG. 4 is a diagram illustrating how an inverse DRC characteristic is used to generate instantaneous loudness values in the decoding side, for adaptation of a loudness equalization filter.

In accordance with an embodiment of the invention, it is possible to use the same, metadata-sourced DRC gain sequence that is intended for the purpose of compression of an audio program, such as defined in MPEG-D DRC, for the purpose of loudness EQ (upon the same audio program during playback.) Referring to FIG. 4, his may be done by applying an inverse DRC characteristic function 20 to the DRC gain sequence (in the decoding side), the smoothed instantaneous loudness values can be recovered, re-interpreted as instantaneous SPL values, and then used to dynamically update the loudness EQ filter 5, such as described above. The inverse may be obtained by, for example, reversing the input and output variables of a mathematical function being one of several DRC gain curves (such as for example those shown in FIG. 3) that is or represents the DRC characteristic that had been applied in the encoding side to compute the sequence of encoded DRC gain values received in the metadata. In other words, the inverse DRC characteristic may be the inverse of a DRC characteristic that was applied to the audio content at the encoding side to produce the DRC gain values. The latter sequence is now applied to the "output" of the mathematical function (or as input to a computed inverse of the mathematical function) to produce a corresponding sequence of loudness values, on a per DRC frame basis, which are treated as instantaneous loudness levels. Note that a reference level offset may be applied to adjust each such instantaneous value of the sequence, e.g., where the offset is a fixed value in dB for example, that represents a reference acoustic level, before feeding the offset adjusted sequence to the filter adaptation block 7. All other aspects of FIG. 4 may be the same as in FIG. 1, including the optional conversion to linear block 22 (not shown in FIG. 1) that may be needed to convert dB values computed by the volume control 4 into linear format, before scaling or multiplying the filtered audio content (of the decoded audio program) emerging from the EQ filter 5 to reflect the current user volume setting.

In accordance with another embodiment of the invention, it is recognized that having a separate DRC gain sequence in the metadata that is exclusively targeted for loudness EQ, is also useful. For that purpose the MPEG-D DRC standard may be extended by additional metadata syntax that carries the information as to which of several gain sequences (that are contained in the metadata) is suitable for loudness EQ (to control the EQ filter 5), and also which frequency range it should control. There may be several of such dedicated DRC gain sequences in the metadata, each being directed to perform loudness EQ upon a different frequency range. Moreover, additional metadata may specify which gain sequence that is to be used for loudness EQ is also suitable for a particular downmix and for dynamic range control, if applicable. This embodiment is illustrated using the block diagram of FIG. 5. The similarities between FIG. 5 and FIG. 4 are apparent, while the differences include: in FIG. 5, dynamic range control (DRC gain adjustment) is applied at a multiplier and is derived from a different DRC gain sequence, sequence 2 (with the optional DRC gain modification block 25 in this case), while in FIG. 4 no DRC gain adjustment is applied; and the EQ filter 5 (loudness EQ) is now being controlled as a function of instantaneous loudness (SPL) values that have been derived from the exclusively targeted, DRC gain sequence 1, and corrected (at the summing unit) by the DRC gain adjustment values that are being simultaneously applied at the multiplier for dynamic control (which are derived from DRC gain sequence 2)

Figure 5:
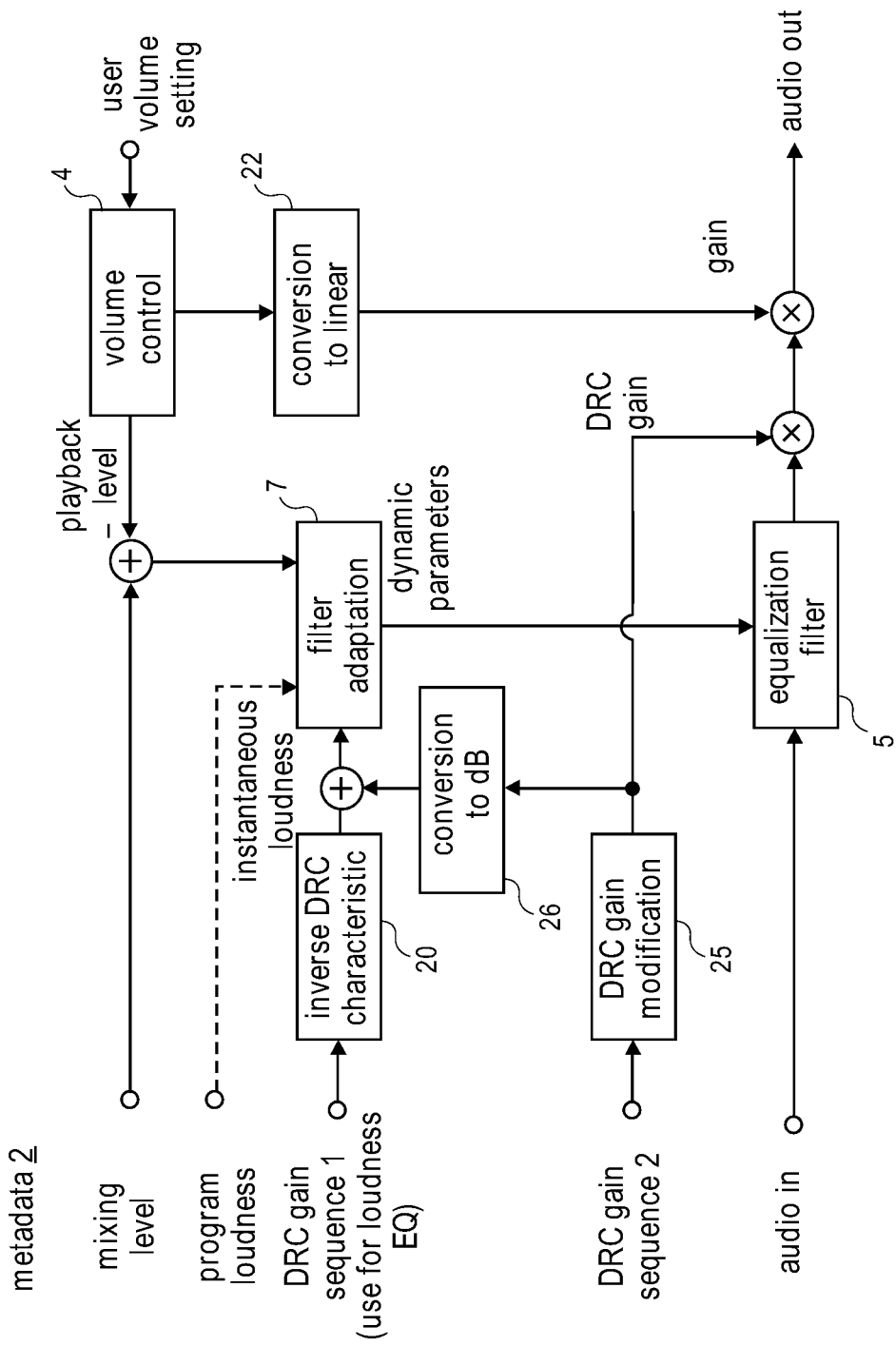
FIG. 5 illustrates a decoding side in which dynamic range compression and loudness equalization are being applied to the audio content.

Also in FIG. 5, instead of the static offset to the instantaneous loudness values, being for example a fixed, reference SPL, a dynamic correction is being made that may be given by the output of a DRC gain modification block 25. The block 25 is optional however, as the correction made to the instantaneous loudness value may instead be given directly by the DRC gain sequence 2 sourced from the metadata. The DRC gain modification block 25 may optionally be included, in order to alter the compression profile or DRC characteristic that is being applied during playback, as compared to what was selected and used by the production/encoding side (to compute the metadata sourced DRC gain sequence.) The DRC gain modification block 25 may be in accordance with the description in US patent app. Pub. No. 2014/0294200 (paras. [0040]-[0045]), producing a so-called "modified" DRC gain (a new DRC gain adjustment value), which may be more suitable for this particular playback system. In either case, the instantaneous loudness sequence that is input to the filter adaptation block 7 is now corrected by a DRC gain value sequence whose gain values are also being applied to scale the audio content, e.g., downstream of the EQ filter 5 as shown by the multiplier in the figure, for purposes of dynamic range control. Thus, with such a technique, a separate sequence of instantaneous loudness values (see above in connection with FIG. 1) need not be included in the metadata (to achieve loudness EQ in the playback side), if the metadata already provides frame by frame DRC gain values.

Figure 6:
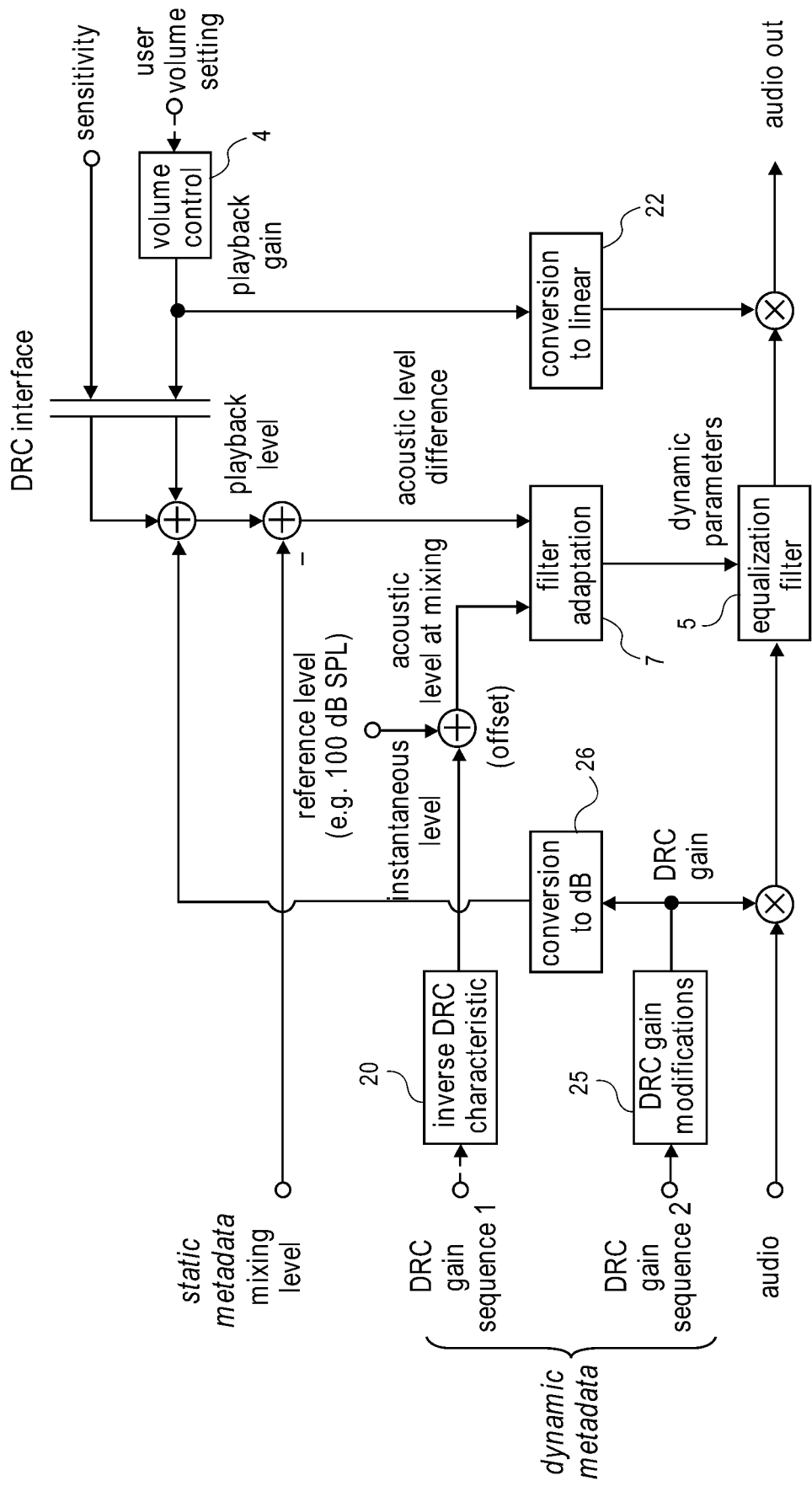
FIG. 6 illustrates a decoding side in which dynamic range compression and dynamic equalization are being applied to the audio content.

In yet another embodiment, referring now to FIG. 6, the loudness EQ scheme of FIG. 4 is combined with DRC, so that dynamic range adjusted audio content is filtered by the EQ filter 5, to ultimately produce both EQ filtered and dynamic range adjusted audio content. This however is done in a different way than was done in FIG. 5 (which also combines loudness EQ and DRC.) Differences relative to FIG. 5 include: providing the instantaneous, acoustic level at mixing to the filter adaptation block 7, by adding a reference level (e.g., a fixed value) to the instantaneous loudness sequence being provided by the application of the inverse DRC characteristic function 20 to a given DRC gain sequence 1 (in the metadata); and dynamically updating an input to the filter adaptation block 7, by adjusting the static difference between playback level and mixing level dynamically in accordance with the DRC gain that is being applied simultaneously. Other differences include the addition of a DRC interface, which is a format to feed control parameters into a DRC block, such as defined in MPEG-D DRC, and the application of the DRC gain to the audio content, upstream of the EQ filter 5 (as compared to downstream of the EQ filter 5 as seen in FIG. 5.)

Dynamic Equalization and DRC

The schemes described above provide a loudness EQ tool that can be combined with DRC such as provided in MPEG-D DRC. For some applications however, the loudness EQ tool may be too complex, or the proper control may not be possible, for example because the playback level is unknown.

In many applications a multi-band DRC is employed to achieve dynamic range compression. In many cases, "dynamic equalization" is also possible, by controlling the compression individually in each DRC band. The following approach provides such a dynamic EQ scheme, for a more general purpose than just loudness EQ.

In the following, a dynamic EQ scheme for DRC is described that works in some ways similarly as the loudness EQ described above. A difference is that it does not take into account the playback level (e.g., as produced by the volume control block 4—FIGS. 1, 4, 5, 6. It rather applies EQ in order to compensate for the coloration effects of dynamic range control, which effects may partially arise from the level changes that are due to the application of DRC and the associated psychoacoustic properties of loudness perception. Other useful applications of the dynamic EQ approach described here include for instance band-pass filtering of a noisy low-level background sound in the audio content, to avoid large amplification of the noise, which may otherwise sound annoying.

The scheme described below can be integrated into MPEG-D DRC (based on metadata). But it can also be used in common real-time dynamic range control (without metadata). It can provide the benefit of dynamic EQ for a single band DRC that was previously only possible if a multiband metadata-based DRC process were supported. A conventional metadata-based single band DRC process applies the same gain to all frequency components, and as such cannot selectively reduce the DRC gain in, for instance, a low frequency range only.

Figure 7:
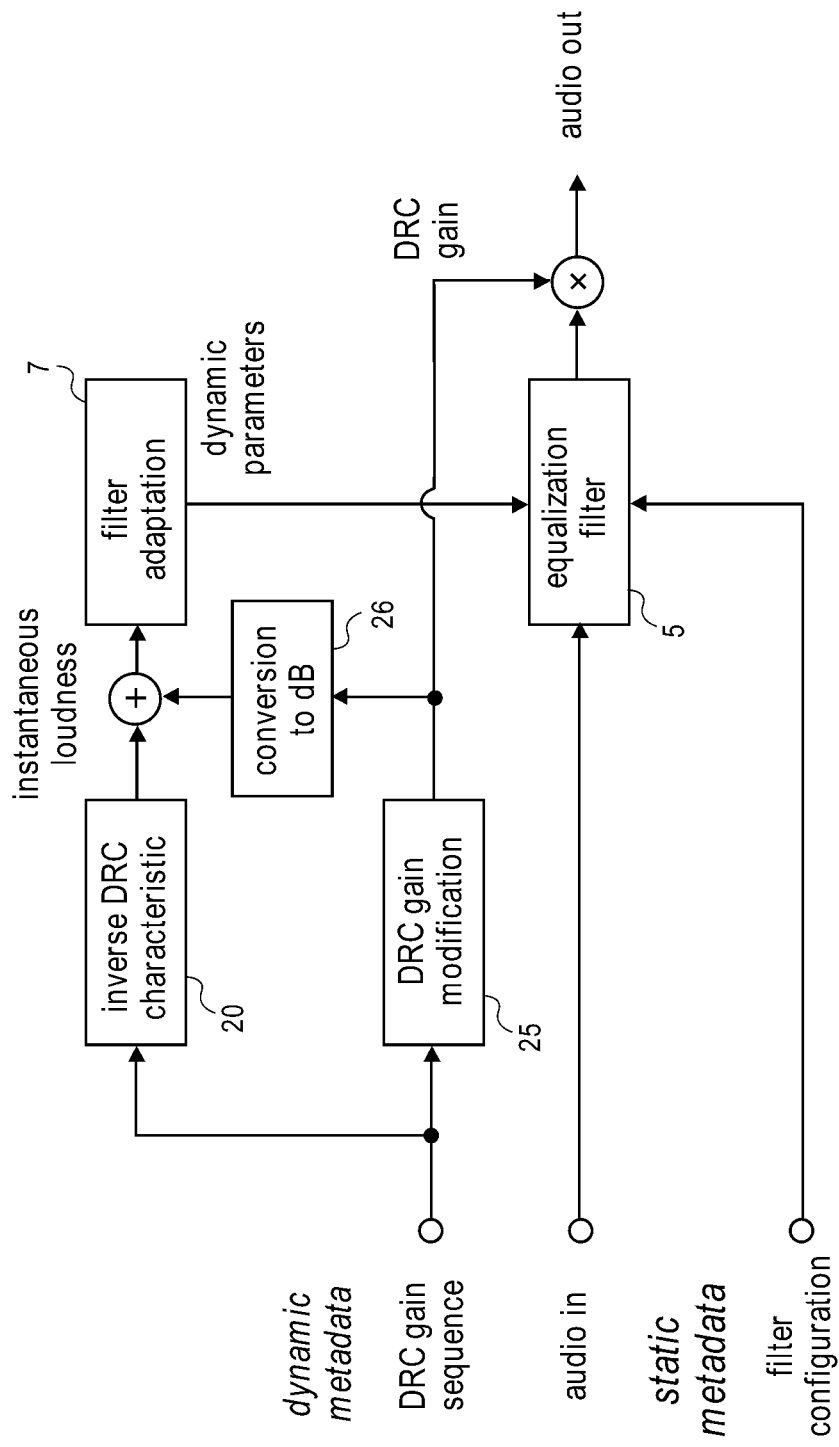
FIG. 7 is a block diagram of another system for loudness equalization in the decoding side.

Moreover, the scheme described below is not limited to the sub-band resolution of a conventional metadata-based multi-band DRC process, and can therefore provide smoother spectral shaping and may have lower computational complexity. FIG. 7 shows an example of DRC capability combined with dynamic EQ. The EQ is dynamically controlled indirectly by the DRC gain sequence, where this aspect is similar to part of FIG. 5 in that it includes the inverse DRC characteristic function 20, the summing unit that corrects the instantaneous loudness by DRC gain values, and the optional DRC gain modification block 25 (the DRC gain values produced by the block 25 are converted into loudness dB values by the conversion to dB block 26.) Here however, the loudness values are obtained by applying the inverse DRC characteristic function 20 to the same, metadata sourced DRC gain sequence that is producing the DRC gain values. In this embodiment, the EQ filter 5 is set up in part based on static metadata conveyed in the bitstream that determines: the filter type (e.g., low-frequency cut/boost, high-frequency cut/boost), the filter strength, and the adaptation frequency range. Note here that the static filter configuration information in the metadata is not needed in the embodiments of the equalizer in FIGS. 1, 4, 5.

In an alternative scheme to that of FIG. 7, the inverse DRC characteristic function 20 is omitted, and the filter adaptation block 7 is driven by the DRC gain values directly to save complexity. In other words, the dynamic parameters that define the EQ filter 5 are computed based directly on the DRC gain values received in the metadata, while those DRC gain values are also processed to compute DRC gain adjustment values (e.g., by the optional DRC modification block 25) that are applied to the EQ filtered audio content (to perform dynamic range control.)

The following statements of invention are now made. An article of manufacture comprises a machine-readable medium having stored therein instructions that when executed by a processor of an audio playback system, perform dynamic audio equalization while applying dynamic range control, as follows. Audio content is received, and metadata for the audio content is also received, wherein the metadata includes a plurality of dynamic range control, DRC, gain values that have been computed for the audio content. An inverse DRC characteristic is applied to the plurality of DRC gain values received in the metadata to compute a plurality of instantaneous loudness values for the audio content. A plurality of dynamic parameters that define an equalization filter are computed, wherein the dynamic parameters are computed based on the computed plurality of instantaneous loudness values. The audio content is filtered by the equalization filter to produce EQ filtered audio content. The plurality of DRC gain values received in the metadata are used to compute a plurality of DRC gain adjustment values. The plurality of DRC gain adjustment values are applied to the EQ filtered audio content to perform dynamic range control. In another embodiment of the dynamic equalization, the computed plurality of instantaneous loudness values are corrected in accordance with the plurality of DRC gain adjustment values, to produce corrected instantaneous loudness values, and wherein the plurality of dynamic parameters that define the equalization filter are computed based on the plurality of corrected instantaneous loudness values. Still further, correcting the computed plurality of instantaneous loudness values may comprise summing the computed plurality of instantaneous loudness values with the plurality of DRC gain adjustment values, in dB format. In another aspect, the metadata includes static filter configuration data that specifies one or more of the following for defining the equalization filter: a) type, such as low-frequency cut or boost, or high-frequency cut or boost, b) filter strength, and c) adaptation or effective frequency range. In that case, the equalization filter as configured in accordance with the static filter configuration data is dynamically modified by the dynamic parameters, while the audio content is passing through it. In still a further aspect, computation of the plurality of dynamic parameters that define the equalization filter does not use a mixing level or a playback level.

An article of manufacture comprises a machine-readable medium having stored therein instructions that when executed by a processor of an audio playback system, perform dynamic audio equalization while applying dynamic range control, as follows. Audio content, and metadata for the audio content, is received, wherein the metadata includes a plurality of dynamic range control, DRC, gain values that have been computed for the audio content. A plurality of dynamic parameters that define an equalization filter are computed, wherein the dynamic parameters are computed based on the DRC gain values received in the metadata. The received audio content is filtered using the equalization filter, to produce EQ filtered audio content. The plurality of DRC gain values received in the metadata are processed to compute a plurality of DRC gain adjustment values. The computed plurality of DRC gain adjustment values applied to the EQ filtered audio content to perform dynamic range control.

While certain embodiments have been described and shown in the accompanying drawings, it is to be understood that such embodiments are merely illustrative of and not restrictive on the broad invention, and that the invention is not limited to the specific constructions and arrangements shown or described, since various other modifications may occur to those of ordinary skill in the art. The description is thus to be regarded as illustrative instead of limiting.

What is claimed is:

1. A method for audio equalization in a playback system that is applying dynamic range control, comprising:
    a) receiving audio content, and metadata for the audio content, wherein the metadata includes a plurality of dynamic range control (DRC) gain values that have been computed for the audio content;
    b) computing a plurality of parameters that define an equalization filter, wherein the parameters are computed based on the plurality of DRC gain values received in the metadata;
    c) passing the audio content through the equalization filter; and
    d) adjusting dynamic range of the audio content by applying the plurality of DRC gain values to the audio content wherein passing the audio content through the equalization filter compensates for coloration effects of adjusting the dynamic range of the audio content, and
    e) providing the audio content as filtered in c) and as dynamic range adjusted in d), to drive a speaker in the playback system.

2. The method of claim 1 wherein the parameters that define the equalization filter are computed directly based on the DRC gain values received in the metadata.

3. The method of claim 2 further comprising processing the plurality of DRC gain values received in the metadata to compute a plurality of DRC gain adjustment values, wherein applying the plurality of DRC gain values to the audio content comprises applying the DRC gain adjustment values to the audio content.

4. The method of claim 2 wherein the metadata includes static filter configuration data that specifies one or more of the following for defining the equalization filter: a) type, as low-frequency cut, low frequency boost, high-frequency cut or high frequency boost, b) filter strength, and c) adaptation or effective frequency range,
    wherein the equalization filter as configured in accordance with the static filter configuration data is dynamically modified by the parameters while the audio content is passing through it.

5. The method of claim 1 further comprising processing the plurality of DRC gain values received in the metadata to compute a plurality of DRC gain adjustment values, wherein applying the plurality of DRC gain values to the audio content comprises applying the DRC gain adjustment values to the audio content.

6. The method of claim 1 wherein the metadata includes static filter configuration data that specifies one or more of the following for defining the equalization filter: a) type, as low-frequency cut, low frequency boost, high-frequency cut or high frequency boost, b) filter strength, and c) adaptation or effective frequency range,
    wherein the equalization filter as configured in accordance with the static filter configuration data is dynamically modified by the parameters, while the audio content is passing through it.

7. The method of claim 1 wherein computing the plurality of parameters that define the equalization filter does not use a mixing level or a playback level.

8. The method of claim 1 wherein passing the audio content through the equalization filter comprises
    band-pass filtering of background noise sound in the audio content to avoid amplification of the background noise sound.

9. The method of claim 8 wherein applying the plurality of DRC gain values to the audio content comprises
    applying single-band DRC in which a same gain is applied to all frequency components of the audio content.

10. An article of manufacture comprising:
    a non-transitory machine readable medium having stored therein instructions that a processor of an audio playback system executes to,
    a) receive audio content, and metadata for the audio content, wherein the metadata includes a plurality of dynamic range control (DRC) gain values that have been computed for the audio content,
    b) compute a plurality of parameters that define an equalization filter by which the audio content is filtered before driving a speaker in the playback system, wherein the parameters are computed based on the plurality of DRC gain values received in the metadata;
    c) pass the audio content through the equalization filter;

d) adjust dynamic range of the audio content by applying the plurality of DRC gain values to the audio content wherein passing the audio content through the equalization filter compensates for coloration effects of adjusting the dynamic range of the audio content, and e) provide the audio content as filtered in c) and as dynamic range adjusted in d), to drive the speaker in the playback system.

11. The article of manufacture of claim 10 wherein the non-transitory machine readable medium has stored therein instructions that the processor executes to compute the parameters that define the equalization filter directly based on the DRC gain values received in the metadata.

12. The article of manufacture of claim 11 wherein the non-transitory machine readable medium has stored therein instructions that the processor executes to process the plurality of DRC gain values received in the metadata to compute a plurality of DRC gain adjustment values, wherein applying the plurality of DRC gain values to the audio content comprises applying the DRC gain adjustment values to the audio content.

13. The article of manufacture of claim 11 wherein the metadata includes static filter configuration data that specifies one or more of the following for defining the equalization filter: a) type, as low-frequency cut, low frequency boost, high-frequency cut or high frequency boost, b) filter strength, and c) adaptation or effective frequency range,
wherein the equalization filter as configured in accordance with the static filter configuration data is dynamically modified by the parameters while the audio content is passing through it.

14. The article of manufacture of claim 10 wherein the non-transitory machine readable medium has stored therein instructions that the processor executes to process the plurality of DRC gain values received in the metadata to compute a plurality of DRC gain adjustment values, wherein applying the plurality of DRC gain values to the audio content comprises applying the DRC gain adjustment values to the audio content.

15. The article of manufacture of claim 10 wherein the metadata includes static filter configuration data that specifies one or more of the following for defining the equalization filter: a) type, as low-frequency cut, low frequency boost, high-frequency cut or high frequency boost, b) filter strength, and c) adaptation or effective frequency range,
wherein the equalization filter as configured in accordance with the static filter configuration data is dynamically modified by the parameters while the audio content is passing through it.

16. The article of manufacture of claim 10 wherein the processor computes the plurality of parameters, that define the equalization filter, without using a mixing level or a playback level.

17. The article of manufacture of claim 10 wherein the non-transitory machine readable medium has stored therein instructions that the processor executes to configure the equalization filter as a band-pass filter which filters the audio content to avoid amplification of background noise sound in the audio content.

18. The article of manufacture of claim 17 wherein the non-transitory machine readable medium has stored therein instructions that the processor executes to apply the plurality of DRC gain values to the audio content by applying single-band DRC in which the same gain is applied to all frequency components of the audio content.

* * * * *